(12) United States Patent
Lai et al.

(10) Patent No.: US 12,740,116 B2
(45) Date of Patent: Sep. 15, 2026

(54) JUNCTION FIELD EFFECT TRANSISTOR DEVICE AND METHOD OF MANUFACTURING THE SAME

(71) Applicant: Richtek Technology Corporation, Zhubei City (TW)

(72) Inventors: Wen-Wei Lai, Taoyuan City (TW); Wu-Te Weng, Hsinchu City (TW)

(73) Assignee: RICHTEK TECHNOLOGY CORPORATION, Zhubei City (TW)

( * ) Notice: Subject to any disclaimer, the term of this patent is extended or adjusted under 35 U.S.C. 154(b) by 435 days.

(21) Appl. No.: 18/473,417

(22) Filed: Sep. 25, 2023

(65) Prior Publication Data

US 2025/0056853 A1 Feb. 13, 2025

(30) Foreign Application Priority Data

Aug. 9, 2023 (TW) ................................ 112129967

(51) Int. Cl.

| | |
|---|---|
| ***H10D 62/13*** | (2025.01) |
| ***H10D 30/83*** | (2025.01) |
| ***H10D 62/17*** | (2025.01) |
| ***H10D 64/00*** | (2025.01) |

(52) U.S. Cl.

CPC .......... *H10D 62/343* (2025.01); *H10D 30/83* (2025.01); *H10D 62/149* (2025.01); *H10D 62/328* (2025.01); *H10D 64/111* (2025.01)

(58) Field of Classification Search

CPC .... H10D 62/343; H10D 30/83; H10D 62/149; H10D 62/328; H10D 30/0512; H10D 62/106

See application file for complete search history.

(56) References Cited

U.S. PATENT DOCUMENTS

| | | | | |
|---|---|---|---|---|
| 9,543,451 | B2 | 1/2017 | Han | |
| 2006/0071247 | A1* | 4/2006 | Chen | H10D 64/411 257/E29.127 |
| 2010/0207174 | A1* | 8/2010 | Tsai | H10D 30/83 257/E21.135 |

(Continued)

FOREIGN PATENT DOCUMENTS

| | | | |
|---|---|---|---|
| CN | 112909083 | A | 6/2021 |
| WO | 2013/185604 | A1 | 12/2013 |

*Primary Examiner* — Marlon T Fletcher

*Assistant Examiner* — Samuel Jonathan Smith

(74) *Attorney, Agent, or Firm* — McClure, Qualey & Rodack, LLP

(57) ABSTRACT

A junction field effect transistor device includes a substrate, a well region, a first top layer, a plurality of source/drain regions, a first isolation structure, a gate, and a plurality of first well slots. The substrate has a first conductivity type. The well region is embedded in the substrate. The well region has a second conductivity type. The first top layer is embedded in the well region. The first top layer has the first conductivity type. The source/drain regions are disposed on a top surface of the well region. The first isolation structure is adjacent to one of the source/drain regions. The gate is disposed on a top surface of the first top layer. The first well slots are disposed below the gate. A second-conductivity-type dopant concentration of the first well slots is lower than a second-conductivity-type dopant concentration of the well region.

20 Claims, 8 Drawing Sheets

(56) References Cited

U.S. PATENT DOCUMENTS

| | | | | |
|---|---|---|---|---|
| 2014/0315358 | A1* | 10/2014 | Huang | H10D 30/83 438/196 |
| 2017/0005205 | A1* | 1/2017 | Chan | H10D 62/126 |
| 2020/0212207 | A1* | 7/2020 | Huang | H10D 30/0512 |

* cited by examiner

JUNCTION FIELD EFFECT TRANSISTOR DEVICE AND METHOD OF MANUFACTURING THE SAME

CROSS REFERENCE TO RELATED APPLICATIONS

This application claims priority of Taiwan Patent Application No. 112129967, filed on Aug. 9, 2023, the entirety of which is incorporated by reference herein.

BACKGROUND OF THE INVENTION

Field of the Invention

The present invention relates to semiconductor manufacturing, and, in particular, to junction field effect transistor devices and methods of manufacturing the same.

Description of the Related Art

Semiconductor devices are widely used in various electronic applications, such as personal computers, mobile phones, digital cameras, and other electronic equipment. As the size of semiconductor devices shrinks, the difficulty of manufacturing semiconductor devices has also increased significantly. Defects may occur during the process of manufacturing semiconductor devices, and these defects may cause damage, or they may cause the device's performance to suffer. For example, junction gate field-effect transistor (JFET) devices are semiconductor devices that control channel current flow by changing the electric field. These JFET devices may have an n-type or a p-type channel, while conventional JFET devices suffer from junction breakdown voltage limit issues. Therefore, further improvements to JFET devices, and methods of manufacturing the same, are required to increase breakdown voltage and reduce device size.

BRIEF SUMMARY OF THE INVENTION

According to some embodiments of the present disclosure, a junction field effect transistor device is provided. The junction field effect transistor device includes a substrate, a well region, a first top layer, a plurality of source/drain regions, a first isolation structure, a gate, and a plurality of first well slots. The substrate has a first conductivity type. The well region is embedded in the substrate. The well region has a second conductivity type that is different from the first conductivity type. The first top layer is embedded in the well region. The first top layer has the first conductivity type. The source/drain regions are disposed on a top surface of the well region. The first isolation structure is adjacent to one of the source/drain regions. The gate is disposed on a top surface of the first top layer. The first well slots are disposed below the gate. A second-conductivity-type dopant concentration of the first well slots is lower than a second-conductivity-type dopant concentration of the well region.

According to some embodiments of the present disclosure, a method of manufacturing a junction field effect transistor device is provided. The method includes forming a well region in a substrate, wherein the substrate has a first conductivity type and the well region has a second conductivity type different from the first conductivity type. The method includes forming a first top layer in the well region, wherein the first top layer has the first conductivity type. The method includes implanting the well region with dopants having a first conductivity type to form a plurality of first well slots. A second-conductivity-type dopant concentration of the first well slots is lower than a second-conductivity-type dopant concentration of the well region. The method includes forming an isolation structure on a top surface of the first top layer. The method includes forming a plurality of source/drain regions on a top surface of the well region. The method includes forming a gate over the first well slots to cover the first well slots.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1:
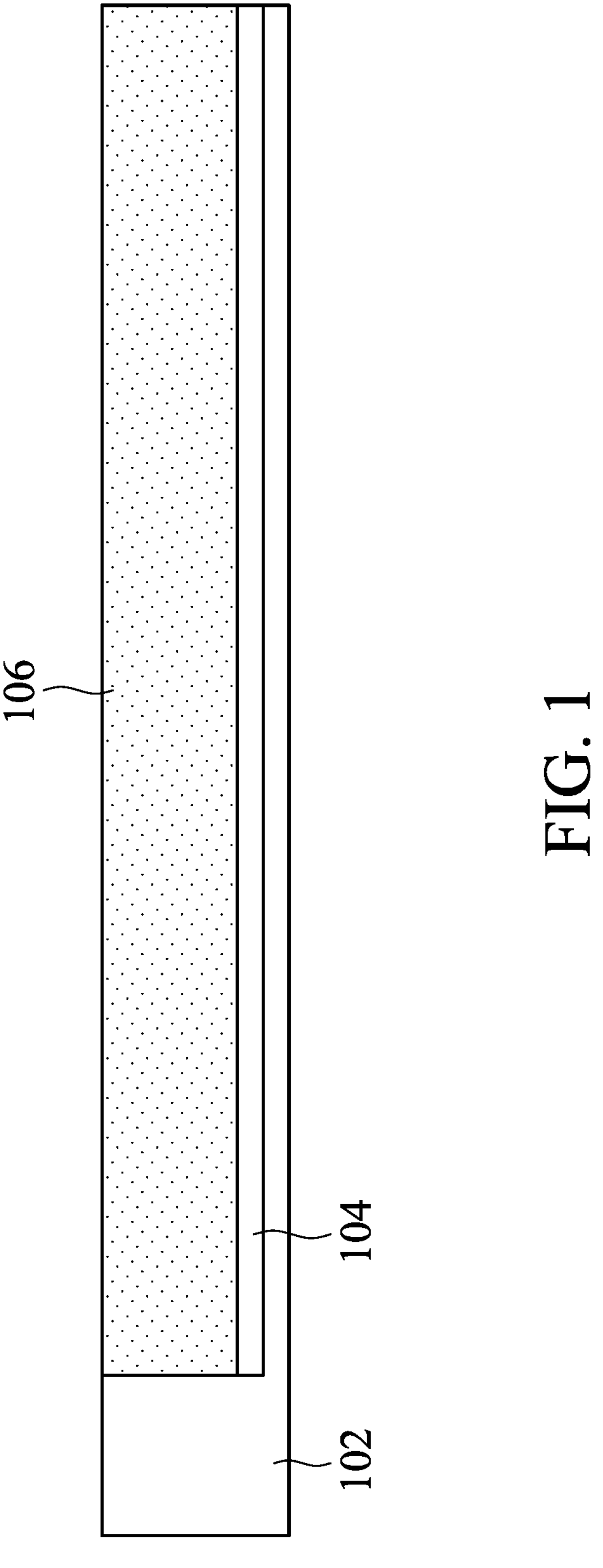
FIGS. 1 to 8 are cross-sectional views illustrating various stages of forming a JFET device according to some embodiments of the present disclosure.

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the order of processes and/or including more or fewer steps than described herein, and these adjustments do not depart from the scope of the present disclosure.

Furthermore, additional elements may be added on the basis of the embodiments described below. For example, the description of "a first element on/over a second element" may include embodiments in which the first element is in direct contact with the second element, and may also include embodiments in which additional elements are disposed between the first element and the second element such that the first element and the second element are not in direct contact. The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

According to some embodiments of the present disclosure, junction field effect transistor (JFET) devices and methods of manufacturing the same are described below. The JFET device according to some embodiments of the present disclosure includes a plurality of well slots and a top layer, which can achieve high breakdown voltage and high driving current, and can shrink the channel length and the distance between the drain and the gate, thereby reducing the size of the JFET device.

FIGS. 1 to 8 are cross-sectional views illustrating various stages of forming a JFET device 100 according to some embodiments of the present disclosure. Additional features can be added to the JFET device 100. Some of the features described below can be replaced or eliminated for different embodiments. To simplify the diagram, only a portion of the JFET device 100 is illustrated.

Referring to FIG. 1, a substrate 102 is provided. The substrate 102 may be formed of any substrate material suitable for JFET devices. For example, the substrate 102 may be formed of elements or compounds, including sapphire, aluminum nitride, aluminum gallium nitride, gallium nitride, silicon, germanium, silicon carbide, gallium arsenide, zinc oxide, indium phosphide, the like, or a combination of thereof. The substrate 102 may be a bulk substrate or a composite substrate which is formed of different materials. The substrate 102 may include a semiconductor-on-insulator (SOI) substrate formed by disposing a semiconductor material on an insulating layer. In an embodiment, the substrate 102 includes an epitaxial layer 104.

The substrate 102 may be doped with P-type or N-type dopants. For example, the P-type dopants may be boron, boron difluoride ($BF_2$), gallium, or a combination thereof, and the N-type dopants may be phosphorus, arsenic, or a combination thereof. The substrate 102 and the epitaxial layer 104 may have the same conductivity type.

One or more semiconductor elements (including active elements and/or passive elements) may be pre-formed on the substrate 102, and in order to simplify the diagram, only the flat substrate 102 is illustrated herein. In the description of the present disclosure, the term "substrate" may include components formed on a semiconductor wafer and various coatings covering the semiconductor wafer.

According to some embodiments, the substrate 102 includes a well region 106. The conductivity type of the well region 106 may be different from that of the substrate 102. According to some embodiments, the substrate 102 and the epitaxial layer 104 are P-type, the well region 106 is N-type, and the formed JFET device 100 is N-type. In some other embodiments, the substrate 102 and the epitaxial layer 104 are N-type, the well region 106 is P-type, and the formed JFET device 100 is P-type.

The well region 106 may be formed by performing an ion implantation process on the substrate 102 using a patterned mask layer. For example, the mask layer may include photoresist, such as a positive photoresist or a negative photoresist. In some embodiments, the mask layer may include a hard mask and may be formed of silicon oxide, silicon nitride, silicon oxynitride, silicon carbide, silicon carbonitride, the like, or a combination thereof. The mask layer may be a single-layer or multi-layer structure. The mask layer may be formed by a deposition process, a photolithography process, other suitable processes, or a combination thereof. In some embodiments, the deposition process includes spin coating, chemical vapor deposition (CVD), atomic layer deposition (ALD), the like, or a combination thereof. For example, the photolithography process may include photoresist coating (e.g., spin coating), soft-baking, mask alignment, exposure, post-exposure baking (PEB), developing, rinsing, drying (e.g., hard baking), other suitable processes, or a combination of thereof.

Figure 2:
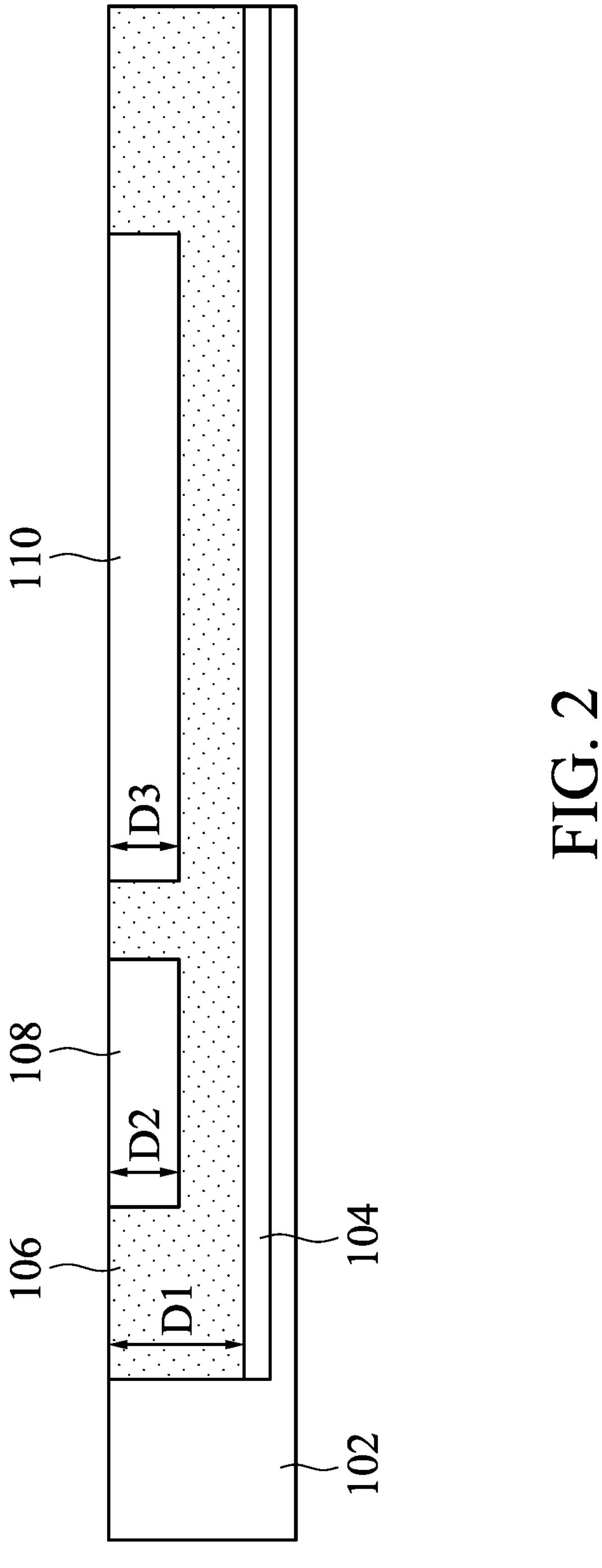

Then, as shown in FIG. 2, according to some embodiments, a first top layer 108 and a second top layer 110 are formed in the well region 106 to adjust the threshold voltage ($V_{th}$) and the drift region, thereby maintaining high breakdown voltage. The first top layer 108 and the second top layer 110 may be formed by performing an ion implantation process on the substrate 102 using a patterned mask layer. In some embodiments, different patterned mask layers are used to form the first top layer 108 and the second top layer 110. The second top layer 110 may be formed after the first top layer 108 is formed. Alternatively, the first top layer 108 may be formed after the second top layer 110 is formed. In some other embodiments, the first top layer 108 and the second top layer 110 may be formed simultaneously.

The conductivity type of the first top layer 108 and the conductivity type of the second top layer 110 may be different from that of the well region 106. For example, in an N-type JFET, the first top layer 108 and the second top layer 110 are P-type. The first top layer 108 and the second top layer 110 may have the same or different dopant concentrations. For example, the first top layer 108 may have a dopant concentration in a range of about 2.5E12 $cm^2$ to about 3E15 $cm^2$, and the second top layer 110 may have a dopant concentration in a range of about 2.5E12 $cm^2$ to about 5E12 $cm^2$.

In some embodiments, the first top layer 108 and the second top layer 110 are separated by a portion of the well region 106. As shown in FIG. 2, the width of the second top layer 110 may be greater than the width of the first top layer 108.

The depth of the first top layer 108 and the depth of the second top layer 110 may be the same or different. The depths of the first top layer 108 and the second top layer 110 may be adjusted to obtain the desired threshold voltage. For example, the ratio of the depth D1 of the well region 106 to the depth D2 of the first top layer 108 may be in a range of about 2 to about 3, and the ratio of the depth D1 of the well region 106 to the depth D3 of the second top layer 108 may be in a range of about 2 to about 3.

Figure 3:
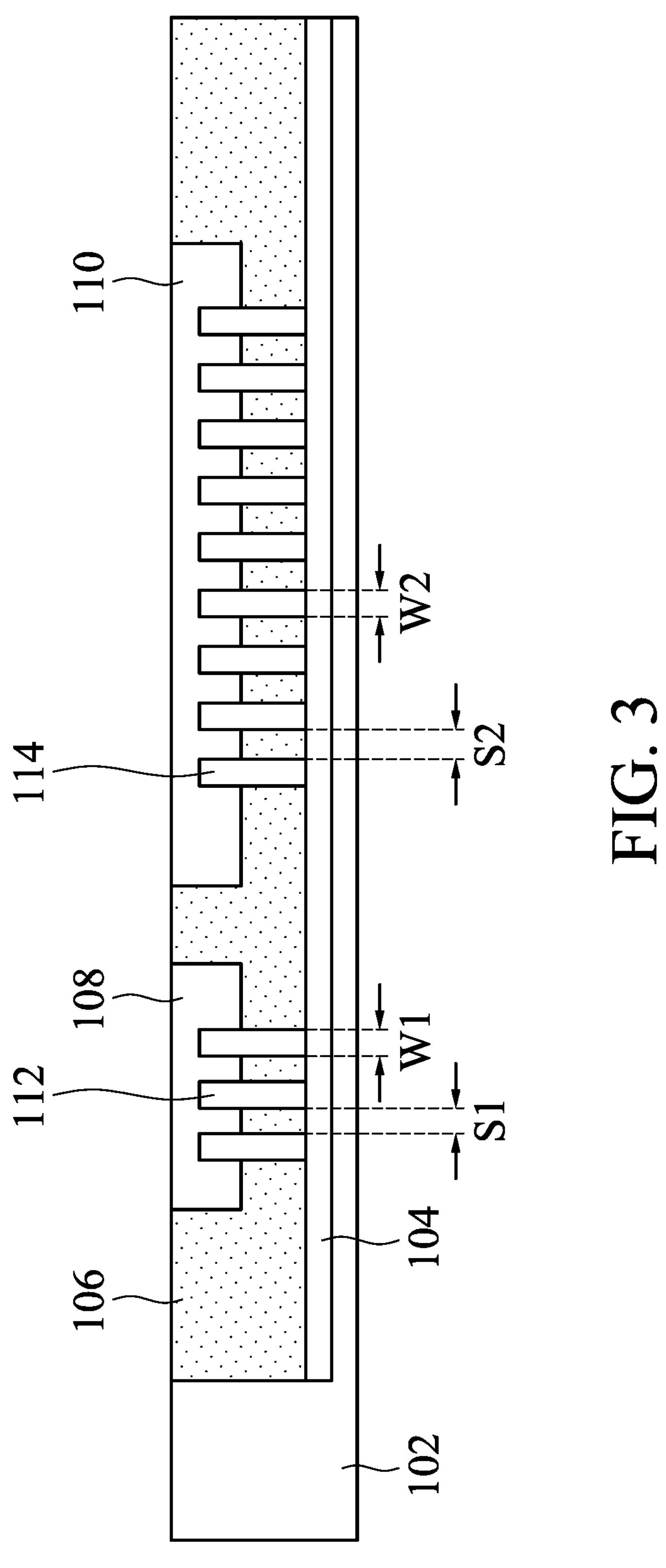

Then, as shown in FIG. 3, according to some embodiments, a plurality of first well slots 112 and a plurality of second well slots 114 are formed in the well region 106 to adjust the threshold voltage and drift region, thereby maintaining high breakdown voltage. The first well slots 112 and the second well slots 114 may pass through the bottom surface of the first top layer 108 and the bottom surface of the second top layer 110, respectively, and extend to the bottom surface of the well region 106.

The conductivity type of the first well slots 112 and the conductivity type of the second well slots 114 may be the same as that of the well region 106. The dopant concentrations of the first well slots 112 and the second well slots 114 may be lower than that of the well region 106. In some embodiments, in an N-type JFET, the first well slots 112 and the second well slots 114 are N-type. The first well slots 112 and the second well slots 114 may be formed by performing an ion implantation process on the substrate 102 using a patterned mask layer. According to some embodiments, dopants having a conductivity type different from that of the well region 106 are implanted where the first well slots 112 and the second well slots 114 are to be formed. For example, the N-type well region 106 may be implanted with P-type dopants to reduce the dopant concentrations in these regions.

The first well slots 112 and the second well slots 114 may have the same or different dopant concentrations. The dopant concentrations of the first well slot 112 and the second well slot 114 may be adjusted to obtain a desired threshold voltage. For example, the first well slots 112 may have a dopant concentration in a range of about 2E12 $cm^2$ to about 2.7E12 $cm^2$, and the second well slots 114 may have a dopant concentration in a range of about 2E12 $cm^2$ to about 2.7E12 $cm^2$.

The number of the second well slots 114 may be greater than the number of the first well slots 112, and these are not limited to the numbers in the figures. The first well slots 112 and the second well slots 114 may have the same or different spacing and width. The spacing S1 between two of the first well slots 112 may be in a range of about 1 μm to about 3 μm, and the spacing S2 between two of the second well slots 114 may be in a range of about 1 μm to about 3 μm. The width W1 of one of the first well slots 112 may be in a range of about 1 μm to about 2 μm, and the width W2 of one of the second well slots 114 may be in a range of about 1 μm to about 2 μm.

Figure 4:
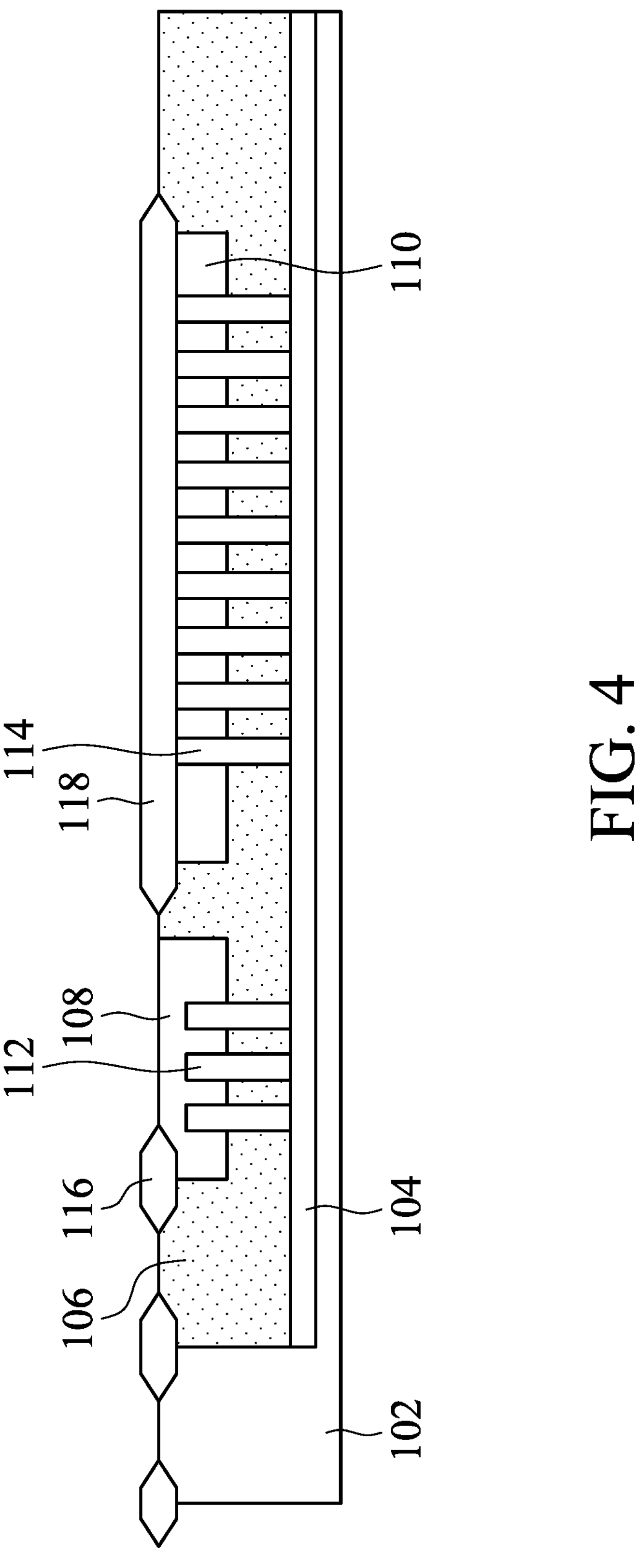

Then, as shown in FIG. 4, according to some embodiments, a plurality of isolation structures 116 and 118 are formed on the top surface of the substrate 102. In some embodiments, the isolation structures 116 and 118 include local oxidation of silicon (LOCOS) isolation structures, and portions of the isolation structures 116 and 118 are embedded in the substrate 102. In some other embodiments, the isolation structures 116 and 118 include shallow trench isolation (STI) structures.

In some embodiments, the isolation structures 116 and 118 are formed of silicon oxide, silicon nitride, silicon oxynitride, the like, or a combination thereof. In some embodiments, the isolation structures 116 and 118 may be formed by a thermal oxidation process, a CVD process, the like, or a combination thereof. The isolation structures 116 and 118 may be formed by etching a plurality of trenches in the substrate 102 using an etching process, and then filling the trenches with the materials of the isolation structures 116 and 118 by a CVD process.

As shown in FIG. 4, the isolation structure 116 may cover the edge of the first top layer 108. The isolation structure 118 may extend over the entire second top layer 110 and may cover both edges of the second top layer 110 and the top surface of the second well slot 114. In some embodiments, the depths of the isolation structures 116 and 118 in the substrate 102 is less than the depth of the first top layer 108 and the depth of the second top layer 110.

Figure 5:
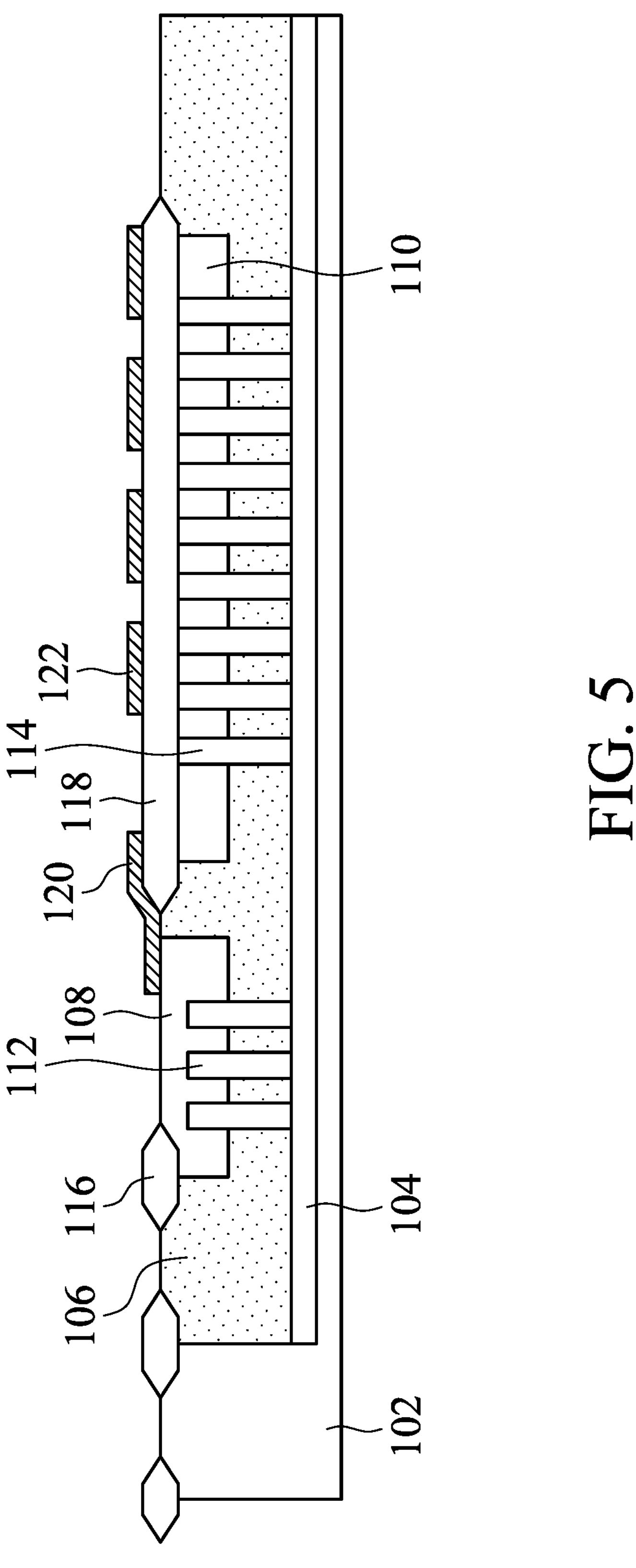

Then, as shown in FIG. 5, according to some embodiments, a gate field plate 120 and one or more source/drain field plates 122 are formed over the top surface of the substrate 102 to maintain a high breakdown voltage. In some embodiments, the material of the gate field plate 120 and the material of the source/drain field plates 122 are deposited over the top surface of the substrate 102, followed by an etching process to simultaneously form the gate field plate 120 and the source/drain field plates 122. In some other embodiments, the gate field plate 120 and the source/drain field plates 122 are formed in different processes.

The materials of the gate field plate 120 and the material of the source/drain field plates 122 may include polysilicon or any suitable conductive materials. The deposition process may include a CVD process, a plasma-enhanced CVD (PECVD) process, an ALD process, the like, or a combination thereof. The etching process may include a dry etching process, a wet etching process, or a combination thereof. For example, the dry etching process may include reactive ion etch (RIE), inductively-coupled plasma (ICP) etch, neutral beam etch (NBE), the like, or a combination of thereof. For example, the wet etching process may use any suitable etchant, including hydrofluoric acid, ammonium hydroxide, or the like.

As shown in FIG. 5, the gate field plate 120 may extend from above the first top layer 108 to above the second top layer 110 and cover the edge of the isolation structure 118. The source/drain field plates 122 may include four as illustrated, but may include more or fewer.

Figure 6:
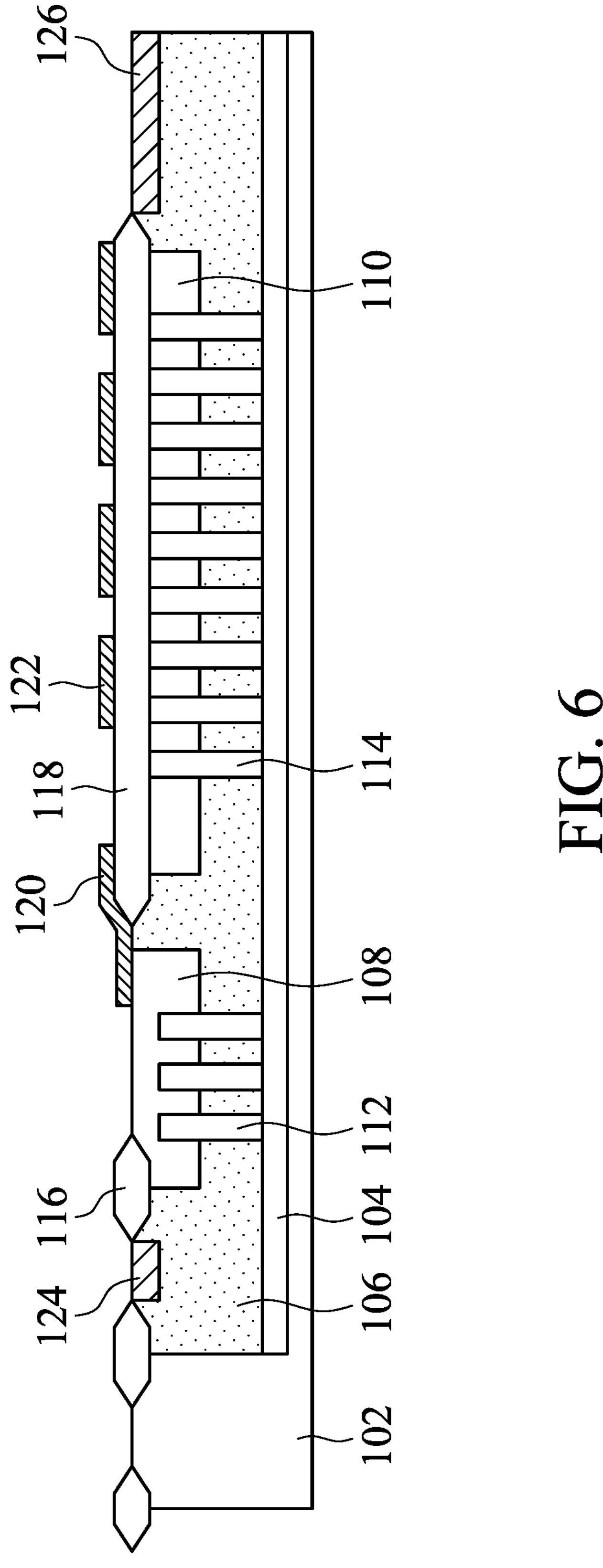

Then, as shown in FIG. 6, according to some embodiments, source/drain regions (e.g., a source region and/or a drain region) 124 and 126, such as the source region 124 and the drain region 126, are formed over the top surface of the well region 106. In some embodiments, the source/drain regions 124 and 126 are formed by one ion implantation process. In some other embodiments, the source/drain regions 124 and 126 are formed in different processes.

The source/drain regions 124 and 126 may have the same conductivity type, and may be the same conductivity type as well region 106. For example, in an N-type JFET, the source/drain regions 124 and 126 are N-type. The dopant concentration of the source/drain regions 124 and 126 may be higher than the dopant concentration of the well region 106.

Figure 7:
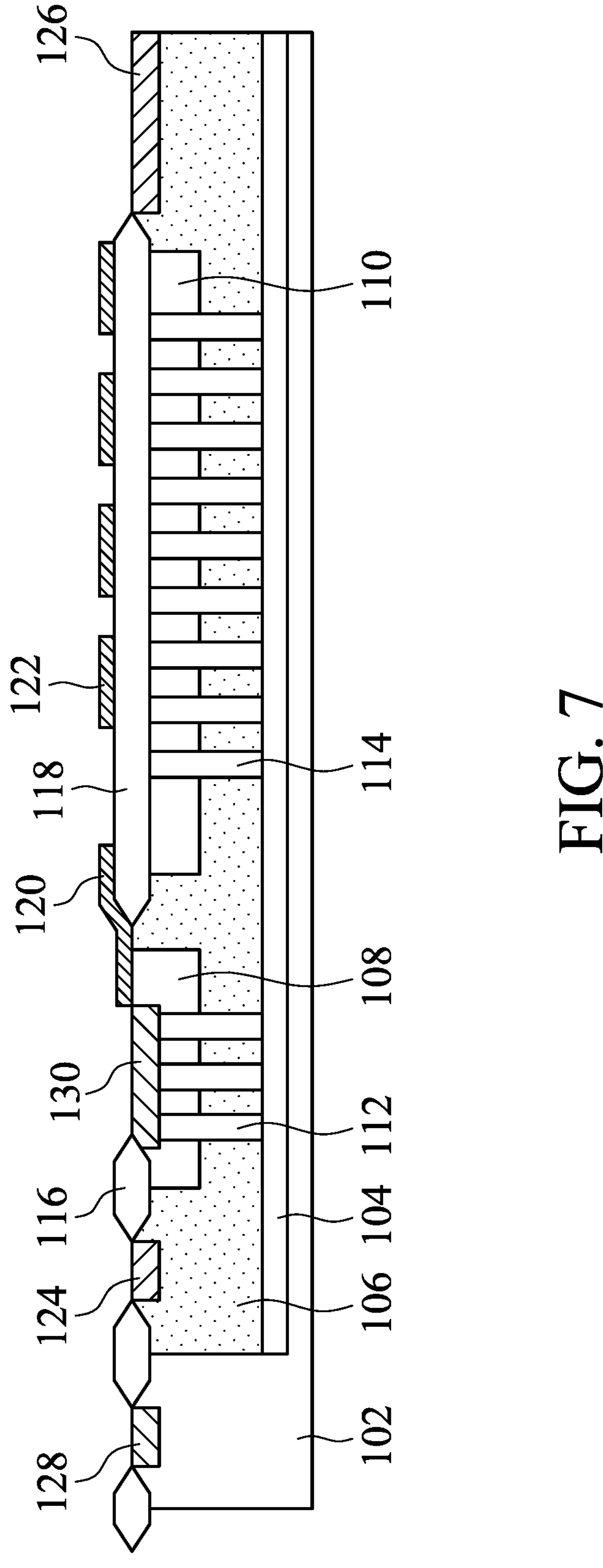

Then, as shown in FIG. 7, according to some embodiments, a doped region 128 and a gate 130 are formed over the top surface of the substrate 102. The gate 130 may be formed over the top surface of the first top layer 108 and may cover the top surfaces of the first well slots 112. In some embodiments, the doped region 128 and the gate 130 are formed by one ion implantation process. In some other embodiments, the doped region 128 and the gate 130 are formed in different processes.

The doped region 128 and the gate 130 may have the same conductivity type, which may be different from the conductivity type of the well region 106. For example, in an N-type JFET, the doped region 128 and the gate 130 may be P-type. The dopant concentration of the doped region 128 may be higher than that of the substrate 102. The dopant concentration of the gate 130 may be higher than that of the first top layer 108.

Although the source/drain regions 124 and 126 are formed before forming the doped region 128 and the gate 130 as illustrated, the present disclosure is not limited thereto, and the process sequence may be adjusted. For example, the doped region 128 and the gate 130 may be formed before forming the source/drain regions 124 and 126.

Figure 8:
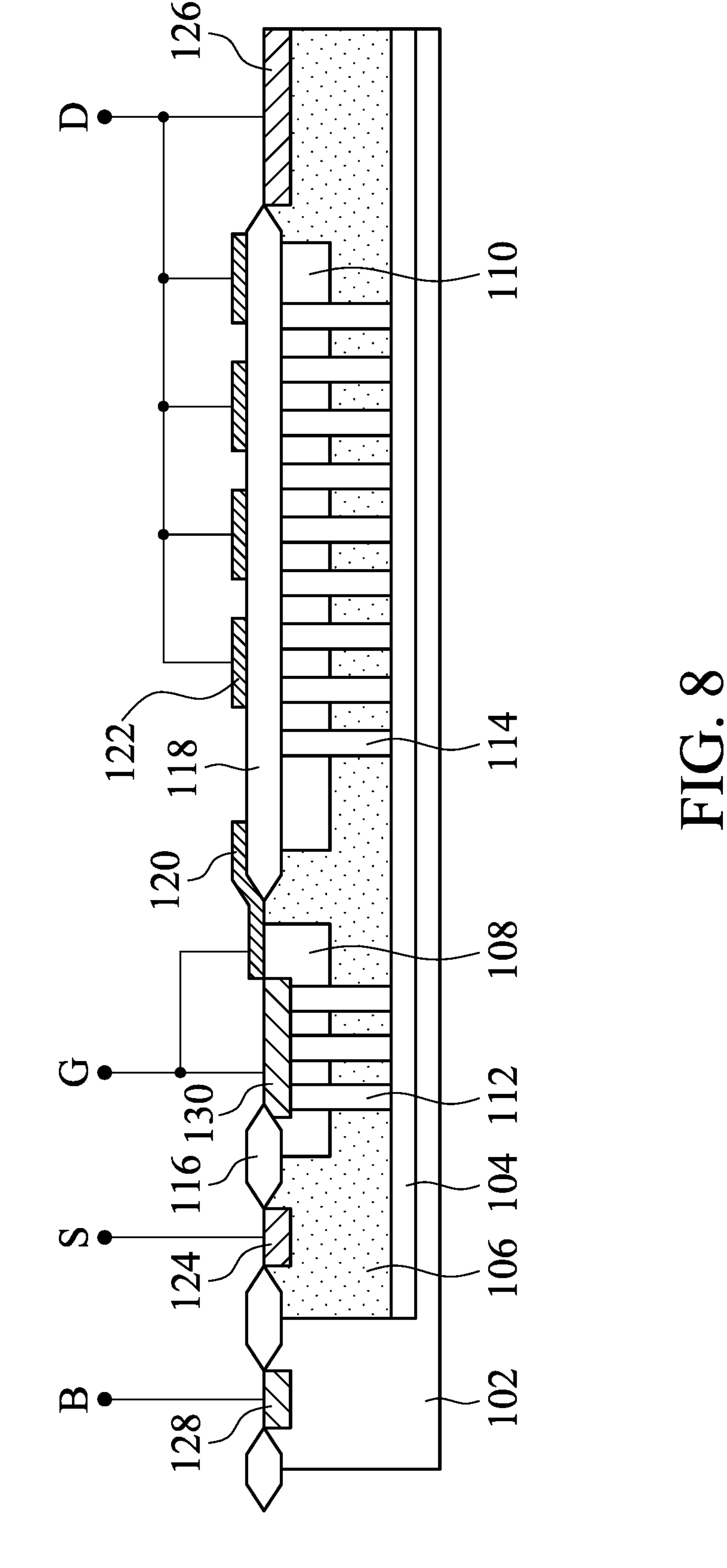

Then, as shown in FIG. 8, according to some embodiments, interconnection structures are formed to respectively electrically connect to the source/drain regions 124, 126, the doped region 128, and the gate 130, and the JFET device 100 is formed. Some of the interconnect structures are electrically connected to the gate 130 and the gate field plate 120, and some of the interconnect structures are electrically connected to one of the source/drain regions (e.g., 126) and the source/drain field plates 122.

In summary, the JFET device according to some embodiments of the present disclosure includes a plurality of well slots and a top layer below a channel region and a drift region. As a result, the threshold voltage can be reduced, the breakdown voltage can be increased, and the channel length and the distance between the drain and the gate (the length of the drift region) can be shortened, thereby reducing the size of the JFET device. In addition, according to some embodiments, a field plate electrically connected to one of source/drain regions or gate is disposed over the drift region, so that a high breakdown voltage can be maintained.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A junction field effect transistor device, comprising:

a substrate having a first conductivity type;

a well region embedded in the substrate and having a second conductivity type that is different from the first conductivity type;

a first top layer embedded in the well region and having the first conductivity type;

a plurality of source/drain regions disposed on a top surface of the well region;

a first isolation structure adjacent to one of the source/drain regions;

a gate disposed on a top surface of the first top layer; and a plurality of first well slots disposed below the gate, wherein a second-conductivity-type dopant concentration of the first well slots is lower than a second-conductivity-type dopant concentration of the well region, and wherein the first well slots pass through a bottom surface of the first top layer.

2. The junction field effect transistor device as claimed in claim 1, further comprising:

a second top layer disposed below the first isolation structure and having the first conductivity type, wherein the first top layer and the second top layer are separated by a distance.

3. The junction field effect transistor device as claimed in claim 1, further comprising:

a gate field plate extending from the top surface of the first top layer to a top surface of the first isolation structure.

4. The junction field effect transistor device as claimed in claim 3, wherein the gate field plate is adjacent to the gate.

5. The junction field effect transistor device as claimed in claim 1, further comprising:

a source/drain field plate disposed over a top surface of the first isolation structure and electrically connected to one of the source/drain regions.

6. The junction field effect transistor device as claimed in claim 1, further comprising:

a plurality of second well slots disposed below the first isolation structure, wherein a second-conductivity-type dopant concentration of the second well slots is lower than the second-conductivity-type dopant concentration of the well region.

7. The junction field effect transistor device as claimed in claim 1, further comprising:

a second isolation structure disposed between one of the source/drain regions and the gate and across an edge of the first top layer.

8. The junction field effect transistor device as claimed in claim 1, wherein a spacing between two of the first well slots is in a range of about 1 μm to about 3 μm.

9. The junction field effect transistor device as claimed in claim 1, wherein a width of one of the first well slots is in a range of about 1 μm to about 2 μm.

10. A method of manufacturing the junction field effect transistor device as claimed in claim 1, comprising:

forming the well region in the substrate, wherein the substrate has the first conductivity type and the well region has the second conductivity type that is different from the first conductivity type;

forming the first top layer in the well region, wherein the first top layer has the first conductivity type;

implanting the well region with dopants having the first conductivity type to form the plurality of first well slots, wherein the second-conductivity-type dopant concentration of the first well slots is lower than the second-conductivity-type dopant concentration of the well region;

forming the isolation structure on the top surface of the first top layer;

forming the plurality of source/drain regions on the top surface of the well region; and forming the gate over the first well slots to cover the first well slots.

11. The method of manufacturing a junction field effect transistor device as claimed in claim 10, further comprising:

before forming the isolation structure, forming a second top layer in the well region, wherein the second top layer has the first conductivity type and is spaced a distance from the first top layer.

12. The method of manufacturing a junction field effect transistor device as claimed in claim 11, further comprising:

before forming the isolation structure, forming a plurality of second well slots in the well region through the second top layer, wherein a second-conductivity-type dopant concentration of the second well slots is lower than the second-conductivity-type dopant concentration of the well region.

13. The method of manufacturing a junction field effect transistor device as claimed in claim 10, further comprising:

forming a plurality of field plates over the isolation structure, wherein the field plates are electrically connected to the gate and one of the source/drain regions.

14. The method of manufacturing a junction field effect transistor device as claimed in claim 13, wherein one of the field plates covers an edge of the isolation structure and an edge of the first top layer.

15. The method of manufacturing a junction field effect transistor device as claimed in claim 10, wherein the second-conductivity-type dopant concentration of the first well slots is in a range of about 5E12 $cm^2$ to about 3E15 $cm^2$, and the second-conductivity-type dopant concentration of the well region is in a range of about 5E12 $cm^2$ to about 3E15 $cm^2$.

16. The method of manufacturing a junction field effect transistor device as claimed in claim 10, wherein the gate has the first conductivity type, and a first-conductivity-type dopant concentration of the gate is higher than a first-conductivity-type dopant concentration of the first top layer.

17. The method of manufacturing a junction field effect transistor device as claimed in claim 16, wherein the first-conductivity-type dopant concentration of the first top layer is in a range of about 2.5E12 $cm^2$ to about 3E12 $cm^2$.

18. The method of manufacturing a junction field effect transistor device as claimed in claim 16, further comprising:

before forming the well region, forming an epitaxial layer in the substrate, wherein the epitaxial layer has the first conductivity type.

19. The method of manufacturing a junction field effect transistor device as claimed in claim 10, further comprising:

forming a doped region in the substrate, wherein a first-conductivity-type dopant concentration of the doped region is higher than a first-conductivity-type dopant concentration of the substrate.

20. The junction field effect transistor device as claimed in claim 2, further comprising:

a plurality of second well slots disposed below the first isolation structure, wherein a second-conductivity-type dopant concentration of the second well slots is lower than the second-conductivity-type dopant concentration of the well region, and wherein the second well slots pass through a bottom surface of the second top layer.

* * * * *